United States Patent [19]

Ameen et al.

[11] Patent Number: 5,989,652
[45] Date of Patent: *Nov. 23, 1999

[54] METHOD OF LOW TEMPERATURE PLASMA ENHANCED CHEMICAL VAPOR DEPOSITION OF TIN FILM OVER TITANIUM FOR USE IN VIA LEVEL APPLICATIONS

[75] Inventors: Michael S. Ameen, Phoenix; Joseph T. Hillman, Scottsdale, both of Ariz.

[73] Assignee: Tokyo Electron Limited, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/791,955

[22] Filed: Jan. 31, 1997

[51] Int. Cl.$^6$ .................................................. C23C 14/02
[52] U.S. Cl. .................... 427/534; 427/250; 427/252; 427/255.2; 427/309; 427/337; 427/343; 427/404; 427/419.7; 427/535; 427/537; 427/576; 427/585
[58] Field of Search ..................... 427/534, 535, 427/537, 576, 585, 250, 252, 255.2, 309, 337, 343, 404, 419.7

[56] References Cited

U.S. PATENT DOCUMENTS

| | | | |
|---|---|---|---|
| 3,807,008 | 4/1974 | Reedy | 29/195 |
| 4,151,325 | 4/1979 | Welch | 428/432 |
| 4,477,311 | 10/1984 | Mimura et al. | 156/643 |

(List continued on next page.)

FOREIGN PATENT DOCUMENTS

| | | | |
|---|---|---|---|
| 0 536 664 A1 | 4/1993 | European Pat. Off. | |
| 63-229814 | 9/1988 | Japan | H01L 21/28 |
| 2-310918 | 12/1990 | Japan | H01L 21/28 |
| 3-135018 | 6/1991 | Japan | H01L 21/28 |
| 4-100221 | 4/1992 | Japan | H01L 21/285 |
| 5-67596 | 3/1993 | Japan | H01L 21/302 |

OTHER PUBLICATIONS

Rie, K., Th. Lampe, St. Eisenberg, Deposition of Titanium Nitride Layers Using Plasma CVD*, 2326 Härterei–Technische Mitteilungen (HTM) 42 (1987) May/Jun., No. 3, Munich, Germany, pp. 1–15 (with translation).

Hilton, M.R. et al, Composition, Morphology and Mechanical Properties of Plasma–Assisted Chemically Vapor–Deposited TiN Films on M2 Tool Steel, Thin Solid Films. 139 (1986) Metallurgical and Protective Coatings, pp. 247–260 (No month avail.).

Taguwa et al., *IEEE Transactions on Electron Devices*, vol. 44, No. 4, pp. 588–593, Apr. 1997.

Rana, V.V.S., et al., *Tungsten and Other Refractory Metals for VLSI Applications*, vol. II, pp. 187–195, E.K. Broadbent ed., Materials Research Society 1987 (no month).

Prasad, Jagdish, et al., Atomic hydrogen cleaning of a TiN surface, Applied Surface Science 74 (1994), pp. 115–120. 1994 Elsevier Science B.V. (no month).

Webster's Ninth New Collegiate Dictionary, no date.

Pierson, *Handbook of Chemical Vapor Deposition*, Noyes Publications, Park Ridge, New Jersey, p. 225, (no month), 1992.

Taguwa et al., International Electron Devices Meeting, Washington, DC., Dec. 10–13, pp. 695–698.

*Primary Examiner*—Bernard Pianalto
*Attorney, Agent, or Firm*—Wood, Herron & Evans, LLP

[57] ABSTRACT

A titanium/titanium nitride film stack can be formed with reduced amounts of impurity by depositing onto a substrate a film of titanium using plasma-enhanced chemical vapor deposition of titanium tetrachloride and hydrogen. This film is then subjected to a hydrogen/argon plasma which significantly reduces the chlorine content of the titanium film. The titanium film can then be subjected to an ammonia plasma which will form a thin layer of titanium nitride which is then coated with a thick layer of titanium nitride using plasma-enhanced chemical vapor deposition of titanium tetrachloride and ammonia. The hydrogen/argon anneal significantly reduces the chlorine content of the titanium film and thus the chlorine content at the titanium substrate interface, particularly when the substrate contains aluminum. This enhances the overall reliability of the formed product.

8 Claims, 2 Drawing Sheets

U.S. PATENT DOCUMENTS

| | | | |
|---|---|---|---|
| 4,535,000 | 8/1985 | Gordon | 427/160 |
| 4,579,609 | 4/1986 | Reif et al. . | |
| 4,871,421 | 10/1989 | Ogle et al. . | |
| 4,897,709 | 1/1990 | Yokoyama et al. | 357/68 |
| 4,977,106 | 12/1990 | Smith | 427/192 |
| 5,139,825 | 8/1992 | Gordon et al. | 427/255.2 |
| 5,173,327 | 12/1992 | Sandhu et al. | 427/38 |
| 5,246,881 | 9/1993 | Sandhu et al. | 437/192 |
| 5,264,297 | 11/1993 | Jindal | 428/698 |
| 5,279,857 | 1/1994 | Eichman et al. | 427/255 |
| 5,291,036 | 3/1994 | Tran et al. | 257/53 |
| 5,296,404 | 3/1994 | Akahori et al. | 437/173 |
| 5,308,655 | 5/1994 | Eichman et al. | 427/248.1 |
| 5,318,654 | 6/1994 | Maruyama et al. | 156/345 |
| 5,342,652 | 8/1994 | Foster et al. . | |
| 5,370,739 | 12/1994 | Foster et al. . | |
| 5,378,501 | 1/1995 | Foster et al. | 427/255.2 |
| 5,391,281 | 2/1995 | Hieronymi et al. . | |
| 5,416,045 | 5/1995 | Kauffman et al. | 437/174 |
| 5,434,110 | 7/1995 | Foster et al. . | |
| 5,487,922 | 1/1996 | Nieh et al. | 427/528 |
| 5,536,193 | 7/1996 | Kumar | 445/50 |
| 5,556,521 | 9/1996 | Ghanbari . | |
| 5,567,243 | 10/1996 | Foster et al. | 118/730 |
| 5,567,483 | 10/1996 | Foster et al. | 427/535 |
| 5,591,672 | 1/1997 | Lee et al. | 437/190 |

METHOD OF LOW TEMPERATURE PLASMA ENHANCED CHEMICAL VAPOR DEPOSITION OF TIN FILM OVER TITANIUM FOR USE IN VIA LEVEL APPLICATIONS

BACKGROUND OF THE INVENTION

Chemical vapor deposition is currently used to form titanium/titanium nitride film stacks that can be used at the via level. There are several ways to initially deposit the titanium film, including sputtering and chemical vapor deposition. In chemical vapor deposition, the titanium precursor, typically titanium tetrachloride or other titanium tetrahalide, is energized to form elemental titanium which is then deposited on a substrate. A plasma can also be used to excite the titanium. In this method, the plasma, along With for example titanium tetrachioride and hydrogen, are formed into a plasma using RF energy. The plasma is then directed at a substrate and the titanium forms on the substrate.

One problem associated with the deposition of titanium using chemical vapor deposition or plasma enhanced chemical vapor deposition of a titanium halide is the residual halide atoms on the surface of the titanium. Particularly when the titanium is deposited over aluminum, this halide can react with the aluminum forming aluminum halide which has a high resistance. This is a significant problem in via-level applications. This affects the operability, reliability and durability of the formed product.

SUMMARY OF THE INVENTION

Accordingly, it is an object of the present invention to provide a method of forming titanium/titanium nitride stacks in via-level applications wherein the halide impurity is minimized.

The present invention, in turn, is premised on the realization that the halide impurities can be minimized in the formation of titanium/titanium nitride stacks wherein the titanium film is subjected to a hydrogen/argon plasma after the deposition of titanium by plasma-enhanced chemical vapor deposition of titanium tetrahalide. The hydrogen/argon plasma reacts with and removes residual chlorine species from the aluminum surface. Subsequent to the hydrogen plasma, a TiN film is deposited by plasma-enhanced chemical vapor deposition. Further, an ammonia-based plasma can be used to further remove chlorine and form a passivating nitride film that reduces the probability of reaction of chlorine with aluminum during the TiN deposition.

The objects and advantages of the present invention will be further appreciated in light of the following detailed description and drawings in which:

DETAILED DESCRIPTION

According to the present invention, titanium nitride film is deposited on a titanium film to form a titanium/titanium nitride stack. For use in the present invention, the titanium film is deposited using plasma-enhanced chemical vapor deposition of titanium tetrahalide, preferably titanium tetrachloride. Subsequent to the deposition of the titanium film, the film is subjected to an argon hydrogen plasma, and then the titanium nitride is deposited. This can be conducted in a single reaction chamber.

Figure 1:
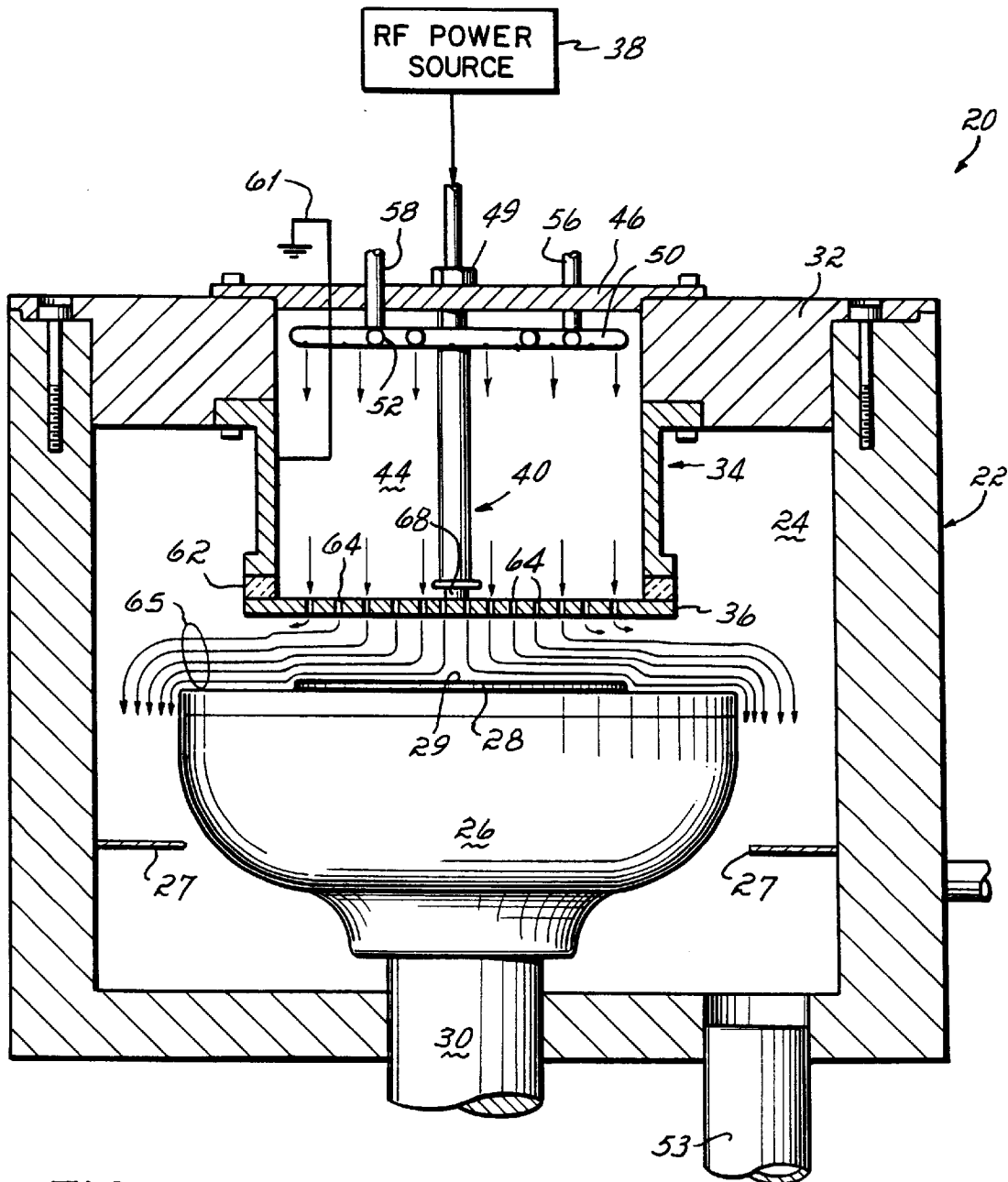
FIG. 1 is a side view, partially in cross-section, of a deposition chamber used to practice the method of the present invention.

Although not limited to any particular apparatus, one preferred apparatus for use in the present invention is a chemical vapor deposition reactor 20 shown in FIG. 1.

Reactor 20, and specifically reaction space 24 within housing 22, may be selectively evacuated to various different internal pressures—for example, from 0.5 to 100 Torr. The susceptor 26 is coupled to a variable speed motor (not shown) by shaft 30 such that the susceptor 26 and substrate 28 may be rotated at various speeds such as between 0 and 2,000 rpm. Susceptor 26 includes a resistance heating element (not shown) coupled to the susceptor 26 to heat substrate 28.

Extending downwardly from the top wall 32 of housing 22 is a cylinder assembly 34 which is attached to a gas-dispersing showerhead 36.

Showerhead 36 is coupled to an RF energy source 38 by an appropriate RF feed line assembly 40 which extends through cover 46 which may, if necessary, include a heat pipe to dissipate unwanted heat. A sealing structure 49 seals the opening around feed line assembly 40. Plasma and reactant gases are introduced into flow passage 44 by concentric rings or halos 50, 52. The concentric rings 50, 52 include a number of holes which evenly dispense the gases around the flow passage 44. Ring 50 is connected to a gas supply through line 56, while ring 52 is connected to a supply by line 58.

An insulator ring 62 separates cylinder 34 and showerhead 36. Cylinder 34 is electrically grounded by ground line 61.

The insulator ring 62 preferably has an outer diameter approximately the same as the outer diameter of showerhead 36 and a width dimension which ensures complete separation of cylinder 34 and showerhead 36 along the entire attachment interface between the cylinder and showerhead. The insulator ring is preferably made of quartz material approximately 0.75 inches thick.

Showerhead/electrode 36 contains a plurality of dispersion holes 64 which disperse the flow of gas over substrate 28. The showerhead 36 includes a stem 68. Stem 68 is formed integrally with the showerhead 36 and forms part of the RF line assembly 40 which connects to showerhead 36. The showerhead 36, including stem 68, is formed of an electrically conductive material, preferably Nickel-200.

The RF power source, through RF feed line assembly 40, biases the showerhead 36 so that the showerhead functions as an RF electrode. The grounded susceptor 26 forms another parallel electrode. An RF field is created, preferably between showerhead 36 and susceptor 26. The RF field created by the biased showerhead/electrode 36 excites the plasma gases which are dispensed through holes 64 so that a plasma is created below showerheadlelectrode 36.

The showerhead employed is about 0.25 inches thick, having a diameter of about 17.3 cm and 600 holes. The number of holes is not critical and could easily be varied from 100 holes to 1,000 or more holes. The holes are preferably less than 1.5 mm in diameter and are more preferably about 0.75 mm. This prevents the plasma from being generated in the hole, thereby reducing efficiency.

The gas flow from injector rings 50 and 52 is allowed to develop within the length of the cylinder 34 as it travels to the showerhead 36. It is desirable for the velocity profile of the incoming plasma gases passing through showerhead 36 to be fully developed before they reach the rotating surface of the substrate 28. Due to the proximity of the showerhead to the surface, that profile must develop in the cylinder 34.

Utilizing cylinder 34 shown in FIG. 1, the showerhead-to-susceptor spacing may be reduced to approximately 30 to 20 mm or less because the velocity profile develops in cylinder 34. Therefore, the length of cylinder 34 from the injector rings 50 and 52 to showerhead 36 should be 40 to 100 mm. As the gases pass through the showerhead 36, the pressure drop across the showerhead 36 flattens out the velocity profile of the gases. As the gases approach showerhead/electrode 36 and pass therethrough, they are excited into a plasma which contacts surface 29.

Preferably, the showerhead 36 can be from about 10 cm to about 10 millimeters from the susceptor, with 20 mm preferred. It is preferred to have the showerhead as close as possible to the substrate while still permitting the substrate or wafer to be removed, although this is not critical for practicing the present invention.

A pumping effect is created by the rotating susceptor 26. The plasma radicals and ions are drawn to the upper surface 29 of substrate 28. Generally, the rotation rate can vary from 0 rpm to 1500 rpm. About 100 rpm is preferred. Further, matched flow does not appear to be critical but can be employed.

With a spacing of about 25 mm between the showerhead and the substrate 28, the created plasma is much closer to the substrate surface 29. With the showerhead 36 acting as an RF electrode, a more uniform plasma is generated, therefore enhancing the uniformity of radical and ion density at the substrate 28 and thereby improving reaction rate.

When employing this apparatus, the electrode is biased—generally at a frequency from about 13.56 MHz (a frequency which is authorized by the Federal Communication Commission)—down to about 55 KHz. The power of the electrode is generally set at about 250 watts.

Using reactor 20, the titanium film is deposited by plasma-enhanced chemical vapor deposition, as disclosed in U.S. Pat. No. 5,567,243. According to this method, titanium tetrahalide is combined with a diluent gas and formed into a plasma using RF energy. This is then deposited upon a substrate.

The substrate can typically be any semiconductor substrate such as silicon, thermal oxides, patterned wafers including metal layers and in particular aluminum layers.

The titanium tetrahalide can be titanium tetrabromide, titanium tetraiodide or titanium tetrachloride. Titanium tetrachloride is preferred due to cost. This will be combined with an inert diluent gas, preferably hydrogen. Other inert diluent gases include helium, argon, neon and xenon. Generally, the molecular ratio of diluent to titanium tetrachloride is from about 1:1500 to about 5:1500.

Adhesion between aluminum and titanium is promoted by minimizing corrosion of the aluminum layer. Corrosion is largely the result of exposure of the aluminum layer to halide ions released from the titanium tetrahalide during deposition. By reducing the flow rate of titanium tetrahalide, the corrosion of the aluminum layer is reduced and adhesion is promoted. Reduction of the titanium tetrahalide flow rate also reduces deposition rate, allowing dissociated titanium atoms additional time to locate stable sites in the underlying aluminum layer. This additional time is particularly beneficial due to the low thermal energy and reduced thermal motion of the titanium atoms at reduced process temperatures.

The flow rate will vary, depending upon the particular reactor. With the present reactor, a flow rate of $TiCl_4$ of 3 to 7 sccm is preferred; and a flow rate of hydrogen of 1000 to 5000 sccm is preferred.

The RF energy can also be varied, depending upon the particular application. The power of the RF energy can be from about 200 watts to about 1 kilowatts at about 450 KHz to 1 MHz.

The reaction chamber also provides for control of the pressure. Generally, the pressure will be from 500 millitorr up to about 10 torr. Under these conditions, the deposition rate should be about 50 Å/minute and therefore the deposition time can vary from about 30 seconds to about 90 seconds, depending upon the desired application.

As shown in the apparatus, the substrate is held on a susceptor 26 which can be rotated. The rotation rate can be from about 0 rpm up to about 1500 rpm. This facilitates a pumping action which draws the plasma to the surface of the substrate. Also, using the present invention the substrate temperature can be adjusted by adjusting the temperature of the susceptor. Generally, to avoid damaging an underlying aluminum layer, the substrate temperature should be about 400 to about 450° C. It is desirable to minimize the temperature in each separate step in order to avoid deformation of the aluminum layer. However, with lower temperatures increased halide formation occurs.

The titanium film is subjected to a plasma immediately after deposition. Preferably, the plasma is formed from a gas selected from hydrogen, argon, mixtures thereof, as well as helium. It is desirable to have at least 1 to 5% hydrogen to react with the halide to form the hydrogen halide or hydrogen chloride compound which is then vented from the reaction chamber.

During the plasma treatment, the RF electrode will operate at about 200 to about 700 watts, with the frequency being from about 450 KHz to 1 MHz. In order to preserve the underlying titanium film and substrate, the temperature should be kept at from about 400 to about 450° C. Generally, the flow rate should be about 1000 SCCM with the reaction pressure varying from about 500 millitorr to about 10 torr. This plasma treatment is continued for a period of 30 to 90 seconds, with about 60 seconds being preferred. Subsequent to the hydrogen/argon plasma treatment, the titanium film can be nitrided using a nitrogen-containing plasma.

Two nitriding gases can be used in the present invention. These are ammonia and nitrogen. Ammonia is preferred because of its better reactivity. The plasma Is created by simply subjecting the nitriding gas to an RF electrode at elevated temperature and reduced pressure. The titanium film is then contacted with this plasma, thereby forming titanium nitride.

Preferably for use in this nitridization step, the RF electrode will be from 100 watts up to the power at which devices are damaged, i.e., about 5 Kilowatts. Approximately 250 watts is adequate. The frequency of the RF electrode should be from about 55 MHz to about 33 KHz. As the frequency is lowered, the temperature of the treatment can also be reduced. The upper frequency is a function of Federal Communication Commission regulation and equipment availability. However, as described below, lower frequencies are generally preferred.

In order to preserve the underlying titanium film and substrate, the temperature should be kept at 400 to 450° C. As the frequency of the electrode is reduced, the temperature can also be reduced. These temperatures provide for excellent nitridization and reduce thermal degradation of the underlying substrate and titanium film.

The time, pressure and flow rates, as well as temperature, can all be varied to increase or decrease the reaction rate of the nitridization. Generally, the minimum flow rate of the nitridization gas should not be less than about 10 sccm. At flow rates above 5,000 sccm there is increased unvented gas without any benefit although flow rates above 10,000 sccm will function. But precise flow rate is not critical for practicing the present invention. Therefore, about 1,000 sccm is preferred. The time can range from 20 seconds up to ten minutes, however 5 minutes is generally acceptable.

The reaction pressure must be subatmospheric and generally will vary from about 500 millitorr to about 3 torr. If one desired to decrease the time, the flow rate and temperature could be increased. Likewise, with reduced temperature increased time is preferred. Likewise, when reducing the temperature, the RF frequency can also be reduced. Plasma power can be increased or decreased, likewise, to alter the time or reaction rate.

The nitridization gas, preferably ammonia or a combination of nitrogen and hydrogen, is introduced through injectors 50 and 52 and flows through the cylinder 34 and through showerhead 36, which creates the plasma from the gas. The flow rate of the gas into cylinder 34 is generally about 1,000 sccm and the pressure within the reaction chamber itself is maintained at about 1 to 3 torr (3 is preferred). The heated susceptor 26 is rotated at a rotation rate of about 100 rpm which, in effect, pumps gas laterally away from the titanium surface 29 as the plasma is forced downwardly toward the titanium surface. This reaction continues for about five minutes. Unreacted ammonia, along with hydrogen, will (as shown by arrows 65) be pulled around baffles 27 and from the reaction chamber 24 through vent 53.

The titanium film 29 will take on a gold luster, indicating the formation of titanium nitride. This nitridization step is optional and may be omitted. However, it does decrease further the halide content of the titanium film, further reducing aluminum corrosion and TiN film adhesion.

Next, the titanium film is subjected to a plasma-enhanced chemical vapor deposition of titanium nitride. The film thickness of the titanium nitride should be from about 200 to about 500 Å.

In depositing the titanium nitride film, a plasma of reactant gases is created using apparatus 20 at showerhead 36. The reactant gases include titanium tetrachloride, ammonia and a diluent. Although diluents such as hydrogen, helium and argon can be employed, nitrogen is preferred. These are combined together and introduced into cylinder 34.

Cylinder 34 is maintained at a pressure from about 0.5 to about 20 torr with about 5 torr being preferred. The substrate is maintained at a temperature of about 400 to about 500° C. with about 450° C. being preferred. The substrate is generally heated by providing heat from the support 30. The support itself is preferably rotated at about 100 rpm or more simply to provide for more even distribution. However, the substrate need not be rotated at all.

The concentration of the gases is controlled by flow rate. Generally, the titanium tetrachloride will be introduced at a flow rate of about 1 to about 40 sccm, with about 10 sccm being preferred. The partial pressure of the $TiCl_4$ must be sufficiently low to form TiN. If the $TiCl_4$ partial pressure becomes too high, a black powder is formed which is not TiN. When the total pressure is 5 torr, the partial pressure of $TiCl_4$ should be less than 0.02 torr, preferably 0.01 torr to 0.001 torr. At the lower pressures (i.e., 0.0001 torr), the reaction rate is significantly reduced and the step coverage can be unacceptable. As the total pressure increases from 5 torr, the partial pressure of $TiCl_4$ can be increased accordingly. For TiN to be useful, the film on the substrate should be adherent and continuous. Films of this nature are gold in color. The black powder that forms is non-adherent (it can be wiped off readily). Therefore, the upper limits of the partial pressure of $TiCl_4$ is that partial pressure at which a black powder begins to form on the substrate. This, of course, can vary depending on the total pressure. Generally, the molar ratio of ammonia to $TiCl_4$ will be from 2:1 (ammonia to $TiCl_4$) up to 100:1. At this higher rate, the reaction rate will be very low. Preferably, the ratio will be about 10:1.

Generally the ratio of diluent to ammonia will range from about 10:1 up to about 10,000:1.

EXAMPLE 1

Figure 2:
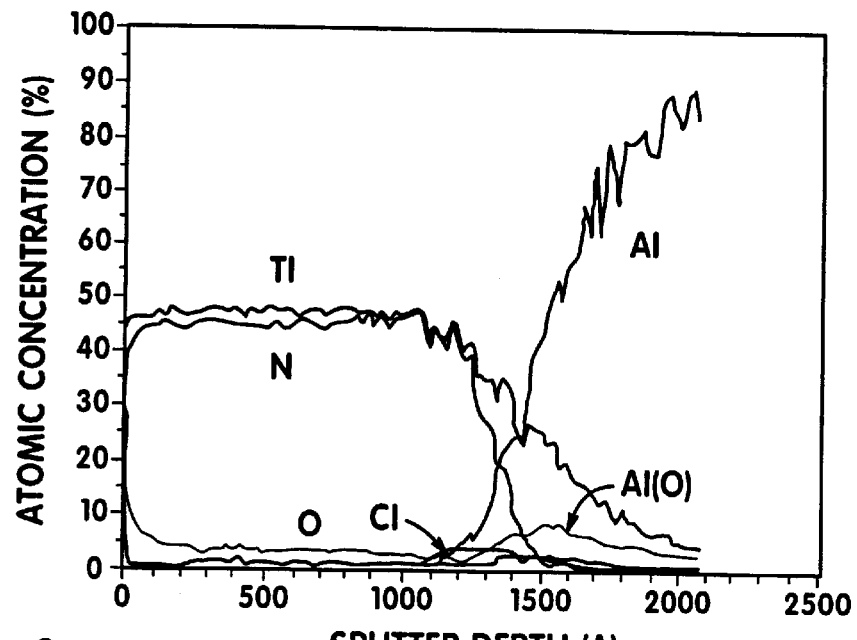
FIG. 2 is an AES Depth Profile of Ti/TiN stacked films formed without a $H_2$/Ar plasma treatment

In order to demonstrate the present invention, a titanium film was deposited and covered with a titanium nitride film. The titanium was deposited under the following conditions:
TiCl 3.5 SCCM
$H_2$ 1500 SCCM
Reaction Pressure 5 torr
Substrate
Rotation Rate 100 rpm
Substrate Temp. 400° C.
Susceptor Temp. 420° C.
Titanium Thickness 150 Å
Reaction Rate 2.5 Å/second
Pressure 5 torr
RF Power 250 watts
Frequency 450 KHz
This was then subjected to an ammonia/plasma anneal under the following conditions:
Ammonia flow rate 450 SCCM
Susceptor Temperature 420° C.
Substrate Temperature 400° C.
Pressure 5 torr
Reaction time 60 seconds
RF Power 500 watts
Frequency 450 KHz
Then a TiN film was deposited under the following reaction conditions:
TiCl Flow Rate 10 SCCM
$NH_3$ Flow Rate 100 SCCM
$H_2$ Flow Rate 0
Reaction Pressure 5 torr
Rotation Rate 100 rpm
Substrate Temp. 400° C.
Susceptor Temp. 420° C.
Reaction Time 180 seconds
Reaction Rate 35 Å/second
RF Power 300 watts
Frequency 450 KHz FIG. 2 shows an AES spectra of the Ti/TiN film stack that was deposited without an intermediate argon/hydrogen plasma between the titanium and TiN deposition. The chlorine is accumulated at the interface of the titanium and aluminum films, bound as either TiCl or the thermodynamically favored Al—Cl species. This film stack was deposited without using the hydrogen\argon plasma treatment between the titanium and titanium nitride films. With this type of process, the chlorine concentration at the interface is measured to be 5–6 atomic percent by Auger. In this case, the film stack did receive a passivating ammonia plasma, but did not receive the additional argon/hydrogen plasma to remove additional chlorine species.

EXAMPLE 2

A titanium film was deposited under the conditions set forth in Example 1. This film was subsequently subjected to an argon/hydrogen plasma under the following conditions:

Argon 300 SCCM $H_2$ 1500 SCCM

Reaction Pressure 5 torr

Substrate

Rotation Rate 100 rpm

Substrate Temp. 400° C.

Susceptor Temp. 420° C.

Reaction Time 60 seconds

RF Power 250 watts

Frequency 450 KHz

Figure 3:
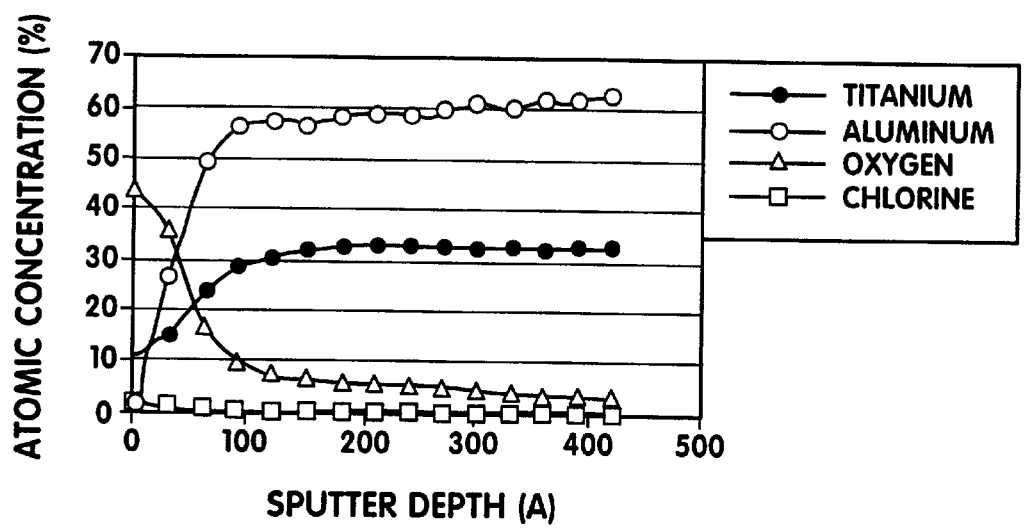
FIG. 3 is an AES Depth Profile of a Ti film subjected to a $H_2$/Ar plasma.

FIG. 3 shows a similar AES depth profile (similar to FIG. 2) of chlorine deposited onto aluminum that has been treated with a post-deposition argon/hydrogen plasma. No TiN was deposited after the titanium, so no ammonia plasma nitridization was used for this film stack. In this case, the chlorine measured at the interface has been reduced to less than 3 atomic percent—one-half the value of Example 1, in spite of the fact that there was no ammonia plasma which should also remove chlorine. Accordingly, this demonstrates that subjecting the titanium film to a hydrogen/argon plasma significantly reduces chlorine content at the titanium/aluminum interface. This is very beneficial, particularly given the fact that it operates at approximately the same pressures and temperatures as the plasma-enhanced chemical vapor deposition of titanium. Thus, it can be conducted in the same module with no transfer steps. The time required is only approximately 30 seconds in duration, and it permits the immediate deposition by plasma-enhanced chemical vapor deposition of TiN.

This has been a description of the present invention, along with the preferred method of practicing the present invention currently known. However, the invention Itself should only be defined by the appended claims, wherein we claim:

What is claimed is:

1. A method of forming a TiN film over a titanium film comprising subjecting said titanium film to a plasma of a mixture of hydrogen and a second gas selected from the group consisting of helium and argon for a time effective to remove residual halide on said titanium surface;

depositing by plasma-enhanced chemical vapor deposition a layer of titanium nitride onto said titanium film:

wherein said titanium film is formed by plasma-enhanced chemical vapor deposition of titanium halide onto a substrate.

2. The method claimed in claim 1 wherein said titanium film is subjected to said hydrogen plasma for a period of 30 to 90 seconds.

3. The method claimed in claim 2 wherein said plasma comprises 95 to 99% hydrogen.

4. The method claimed in claim 2 wherein said titanium film is subjected to said plasma at a temperature of from about 400 to about 450° C.

5. The method claimed in claim 4 wherein said substrate comprises aluminum.

6. A method of forming a titanium/titanium nitride film stack over a substrate comprising at least in part aluminum, comprising:

(a) depositing a titanium layer over said substrate by plasma-enhanced chemical vapor deposition of titanium tetrachloride;

(b) subjecting said titanium film to a hydrogen/argon plasma for a time of 30 to about 90 seconds at a temperature of about 400 to about 450° C.;

(c) depositing a film of titanium nitride over said titanium film by plasma-enhanced chemical vapor deposition of titanium tetrachloride in a nitrogen-containing gas at a temperature of less than about 450° C.

7. The method claimed in claim 6 further comprising subjecting said titanium film to an ammonia plasma.

8. The method claimed in claim 7 further comprising subjecting said titanium nitride film to an ammonia plasma.

* * * * *

UNITED STATES PATENT AND TRADEMARK OFFICE
CERTIFICATE OF CORRECTION

PATENT NO. : 5,989,652
DATED : November 23, 1999
INVENTOR(S) : Ameen et al.

It is certified that error appears in the above-identified patent and that said Letters Patent is hereby corrected as shown below:

Column 1, line 17 reads "along With for" and should read --along with for--.

Column 1, line 18 reads "tetrachioride" and should read --tetrachloride--.

Column 2, line 58 reads "showerheadelectrode" and should read --showerhead/electrode--.

Column 4, line 47 reads "plasma Is created" and should read --plasma is created--.

Column 6, line 65 reads "hydrogenlargon" and should read --hydrogen/argon--.

Column 7, line 27 reads "forthis" and should read -- for this--.

Column 8, line 1 reads "invention Itself should" and should read --invention itself should--.

Signed and Sealed this

Twenty-second Day of May, 2001

Attest:

NICHOLAS P. GODICI

Attesting Officer

Acting Director of the United States Patent and Trademark Office